US012787368B2

(12) United States Patent
Mulfinger et al.

(10) Patent No.: US 12,787,368 B2

(45) Date of Patent: Nov. 3, 2026

(54) OPENING IN STRESS-INDUCING LINER(S) BETWEEN TRANSISTORS

(71) Applicant: GlobalFoundries U.S. Inc., Malta, NY (US)

(72) Inventors: George Robert Mulfinger, Queensbury, NY (US); Selina A. Mala, Ballston Spa, NY (US); Pushparaj Dirgharaj Pathak, Ballston Spa, NY (US); Chung Foong Tan, Ballston Spa, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 523 days.

(21) Appl. No.: 18/345,001

(22) Filed: Jun. 30, 2023

(65) Prior Publication Data

US 2025/0006842 A1 Jan. 2, 2025

(51) Int. Cl.

| | |
|---|---|
| ***H01L 29/78*** | (2006.01) |
| ***H01L 21/84*** | (2006.01) |
| ***H01L 27/12*** | (2006.01) |
| ***H10D 30/69*** | (2025.01) |
| ***H10D 86/00*** | (2025.01) |
| ***H10D 86/01*** | (2025.01) |

(52) U.S. Cl.

CPC ........... *H10D 30/792* (2025.01); *H10D 86/01* (2025.01); *H10D 86/201* (2025.01)

(58) Field of Classification Search

CPC ..... H10D 30/792; H10D 86/01; H10D 86/201

See application file for complete search history.

(56) References Cited

U.S. PATENT DOCUMENTS

| | | | | |
|---|---|---|---|---|
| 6,229,342 | B1 * | 5/2001 | Noble .................. | H10D 86/201 257/351 |
| 7,087,507 | B2 | 8/2006 | Koldiaev et al. | |
| 8,558,278 | B2 * | 10/2013 | Chuang ................ | H10D 84/038 257/190 |
| 8,890,245 | B2 | 11/2014 | Cheng et al. | |
| 2004/0038488 | A1 * | 2/2004 | Mouli ................ | H10D 30/6708 257/E27.111 |
| 2020/0286996 | A1 | 9/2020 | Majhi et al. | |

* cited by examiner

*Primary Examiner* — John A Bodnar

(74) *Attorney, Agent, or Firm* — Erica Ee; Hoffman Warnick LLC

(57) ABSTRACT

A structure includes a substrate, a first transistor on the substrate and a second transistor on the substrate. The second transistor is spaced apart from the first transistor by an isolation region. At least one stress-inducing liner is over the first transistor and the second transistor. An opening extends through at least one stress-inducing liner over at least the isolation region, and a dielectric layer is in at least a portion of the opening. The structure allows for local enhanced high-pressure deuterium (HPD) passivation, which increases threshold voltage of the transistors and improves hot carrier injection with no additional masking. A method of forming the structure is also provided.

20 Claims, 13 Drawing Sheets

OPENING IN STRESS-INDUCING LINER(S) BETWEEN TRANSISTORS

BACKGROUND

The present disclosure relates to integrated circuit structures and, more particularly, to a structure including an opening in at least one stress-inducing liner between transistors.

Integrated circuits (ICs) with ultra-high threshold voltage devices are desirable for a wide variety of applications. Ultra-high threshold voltage devices may have threshold voltages, i.e., the voltage at which the device turns on, of greater than 400 milli-Volts. Ultra-high threshold voltage devices may be formed, for example, by thickening a gate dielectric layer or using higher dopant concentrations in parts of the ICs. Unfortunately, these approaches require adding additional mask layers or processing steps. For example, both of these approaches require additional and expensive masks to create the thicker gate dielectric layer and/or to direct the additional doping processes. These processes can also negatively affect hot carrier injection (HCl) and reliability, especially relative to n-type field effect transistors (nFETs). HCl is a situation in transistors where charge carriers (e.g., electrons in nFETs or holes in p-type field effect transistors (pFETs)) obtain sufficient energy to overcome a barrier required to break an interface state such that the charged carriers become trapped in a gate dielectric layer of the transistor, permanently changing the operational characteristics of the transistor. Another approach uses a high-pressure deuterium (HPD) anneal that injects deuterium to the interface of the gate and gate dielectric layer, which increases threshold voltage and improves HCl. While the HPD anneal reduces the need for additional masks, it is expensive to perform for a sufficient duration to achieve a desired threshold voltage increase and improved HCl.

SUMMARY

All aspects, examples and features mentioned below can be combined in any technically possible way.

An aspect of the disclosure provides a structure, comprising: a substrate; a first transistor on the substrate and a second transistor on the substrate, the second transistor spaced apart from the first transistor by an isolation region; at least one dielectric liner over the first transistor and the second transistor; an opening through the at least one dielectric liner over at least the isolation region; and a dielectric layer in at least a portion of the opening.

An aspect of the disclosure provides a structure, comprising: a substrate; a n-type transistor on the substrate; a p-type transistor on the substrate, the p-type transistor spaced apart from the n-type transistor by an isolation region; a tensile stress-inducing liner over the n-type transistor; a compressive stress-inducing liner over the p-type transistor; an opening through the tensile stress-inducing liner and the compressive stress-inducing liner, the opening over at least a first portion of the n-type transistor and over at least a second portion of the p-type transistor; and a dielectric layer in at least a portion of the opening.

An aspect of the disclosure provides a method comprising: forming a first transistor on a substrate and a second transistor on the substrate, the second transistor spaced apart from the first transistor by an isolation region; forming at least one stress-inducing liner over the first transistor and the second transistor; forming an opening through the at least one stress-inducing liner over at least the isolation region; and filling the opening with a dielectric layer.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
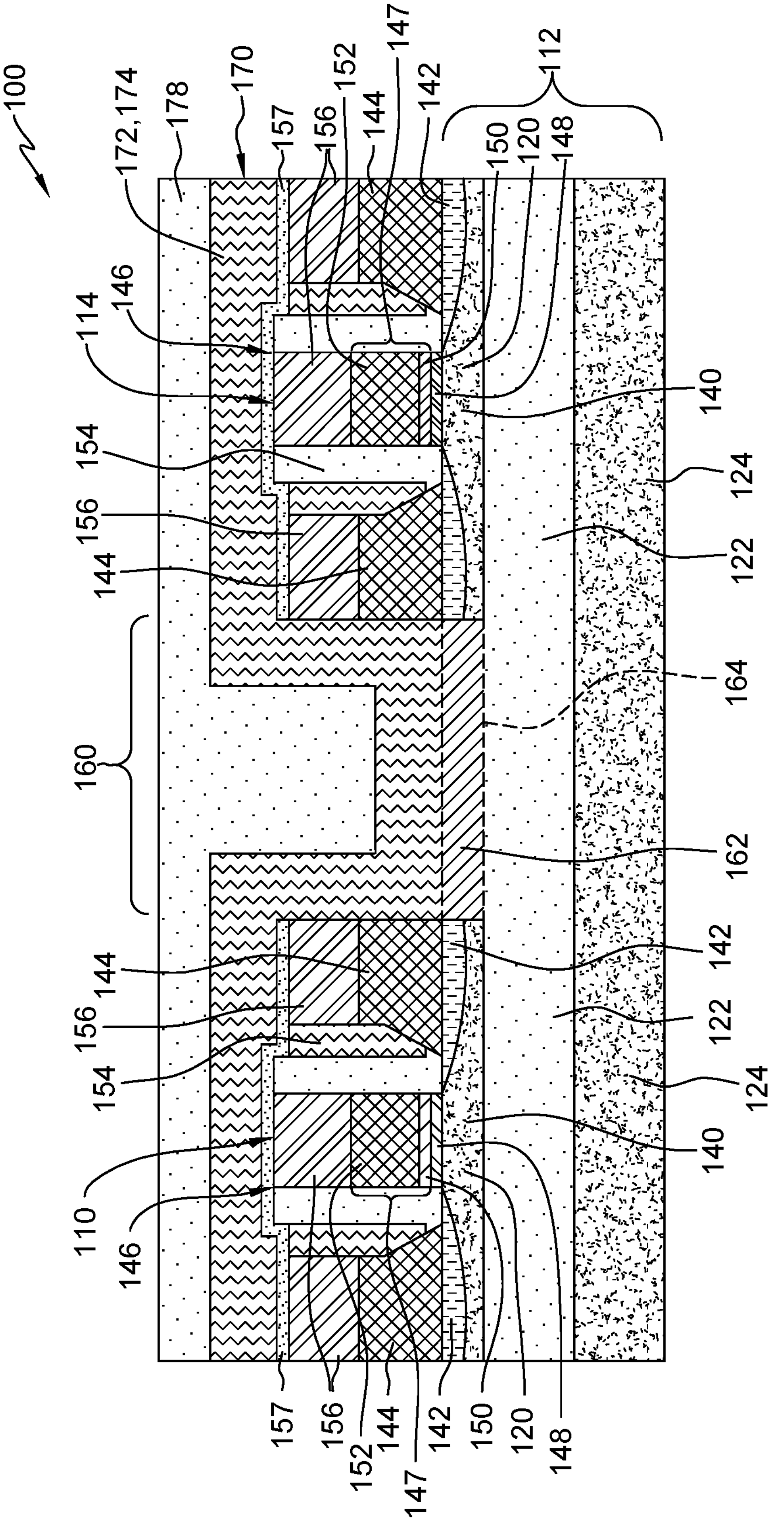
FIG. 1 shows a cross-sectional view of a preliminary structure including a stress-inducing liner for a method, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being “on” or “over” another element, it may be directly on the other element or intervening elements may also be present. In contrast, when an element is referred to as being “directly on” or “directly over” another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include a structure including a substrate, a first transistor on the substrate and a second transistor on the substrate. The second transistor is spaced apart from the first transistor by an isolation region. At least one dielectric liner, i.e., a stress-inducing liner, is over the first transistor and the second transistor. An opening extends through the at least one stress-inducing liner over at least the isolation region, and a dielectric layer is in at least a portion of the opening. The structure allows for local enhanced high-pressure deuterium (HPD) passivation, which increases the threshold voltage (Vt) of the transistors and improves hot carrier injection with no additional masking. A method of forming the structure is also provided.

Figure 2A:
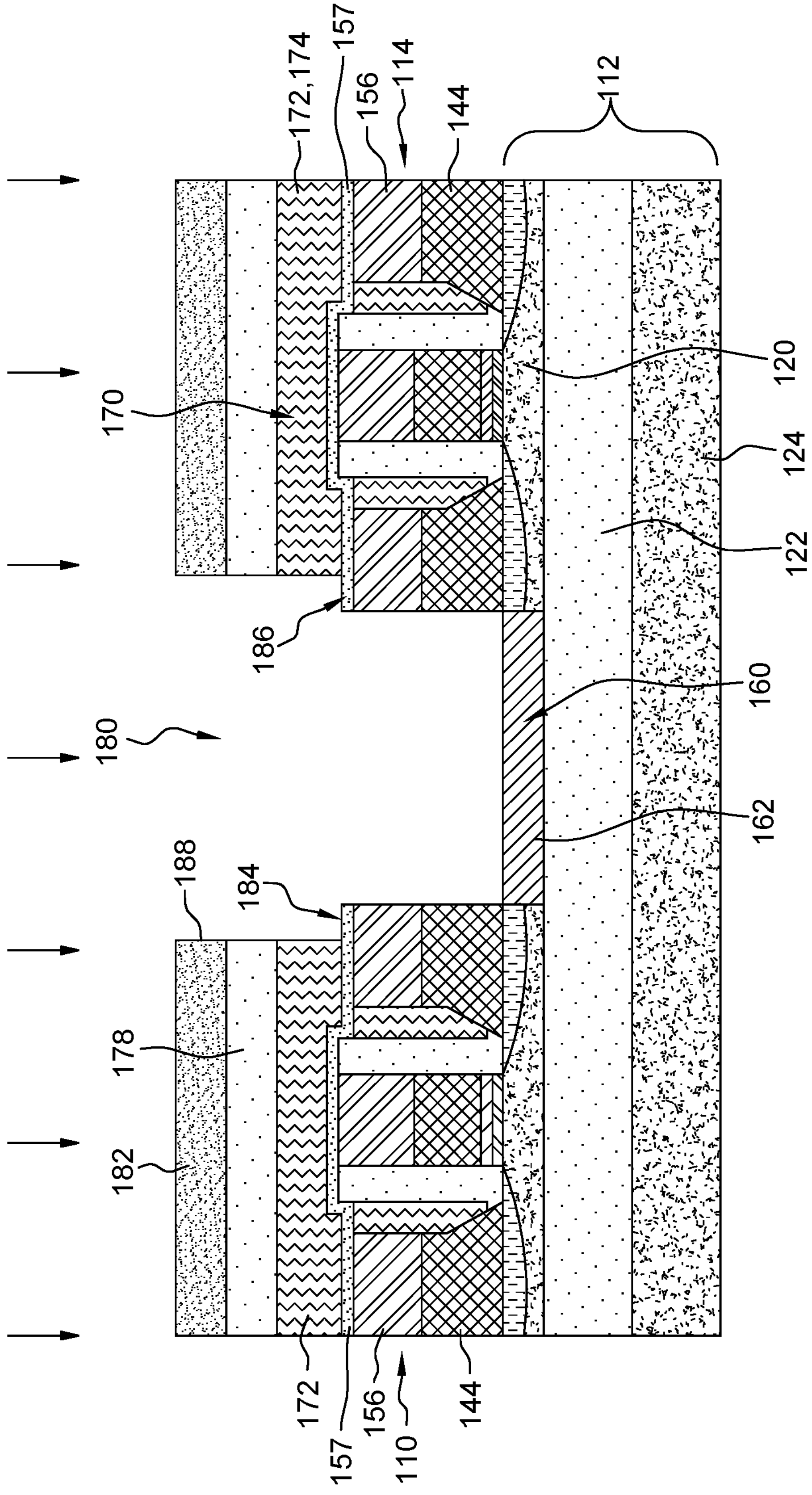
FIGS. 2A-B show cross-sectional views of forming an opening through a single stress-inducing liner in a method, according to embodiments of the disclosure.
Figure 2B:
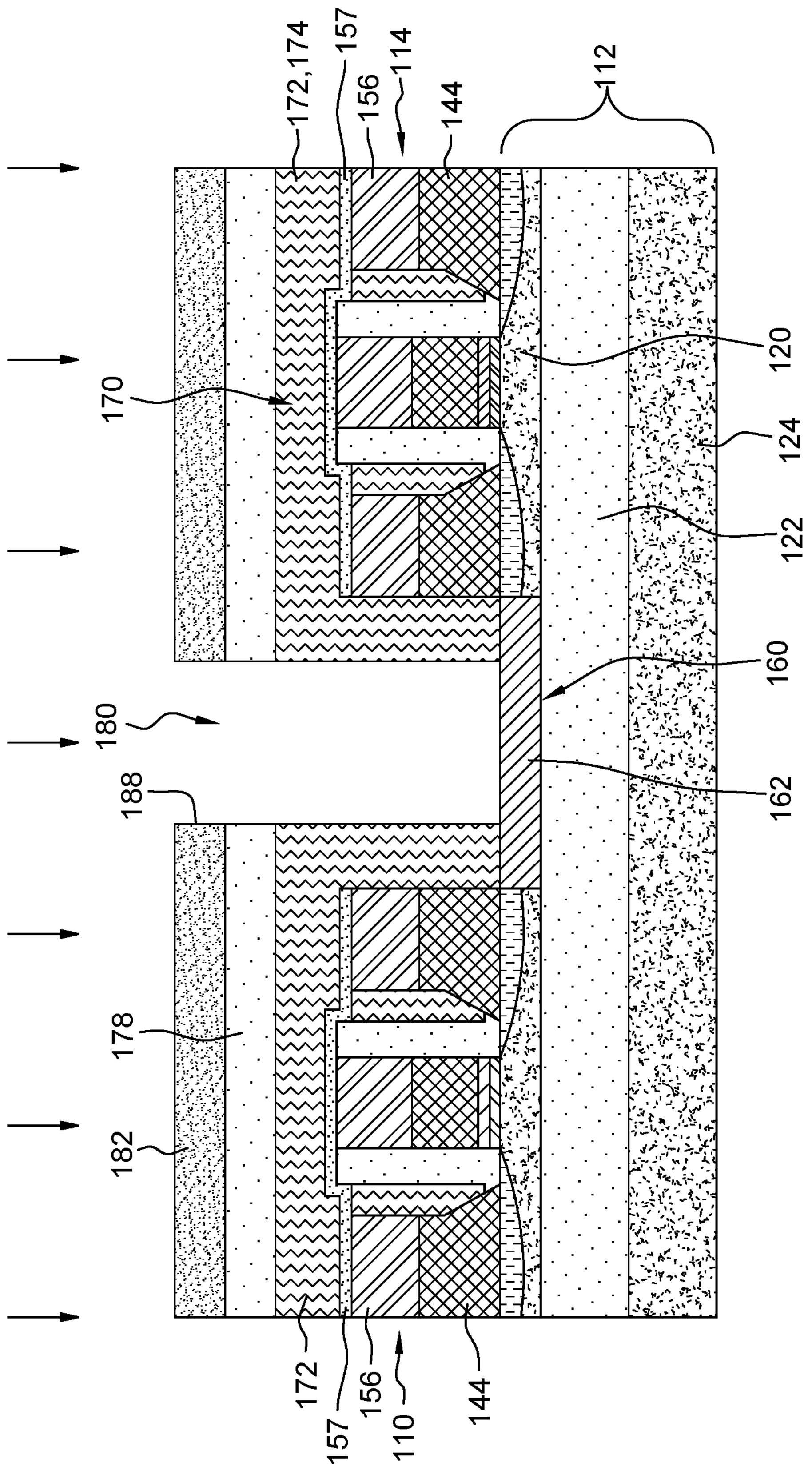
Figure 3:
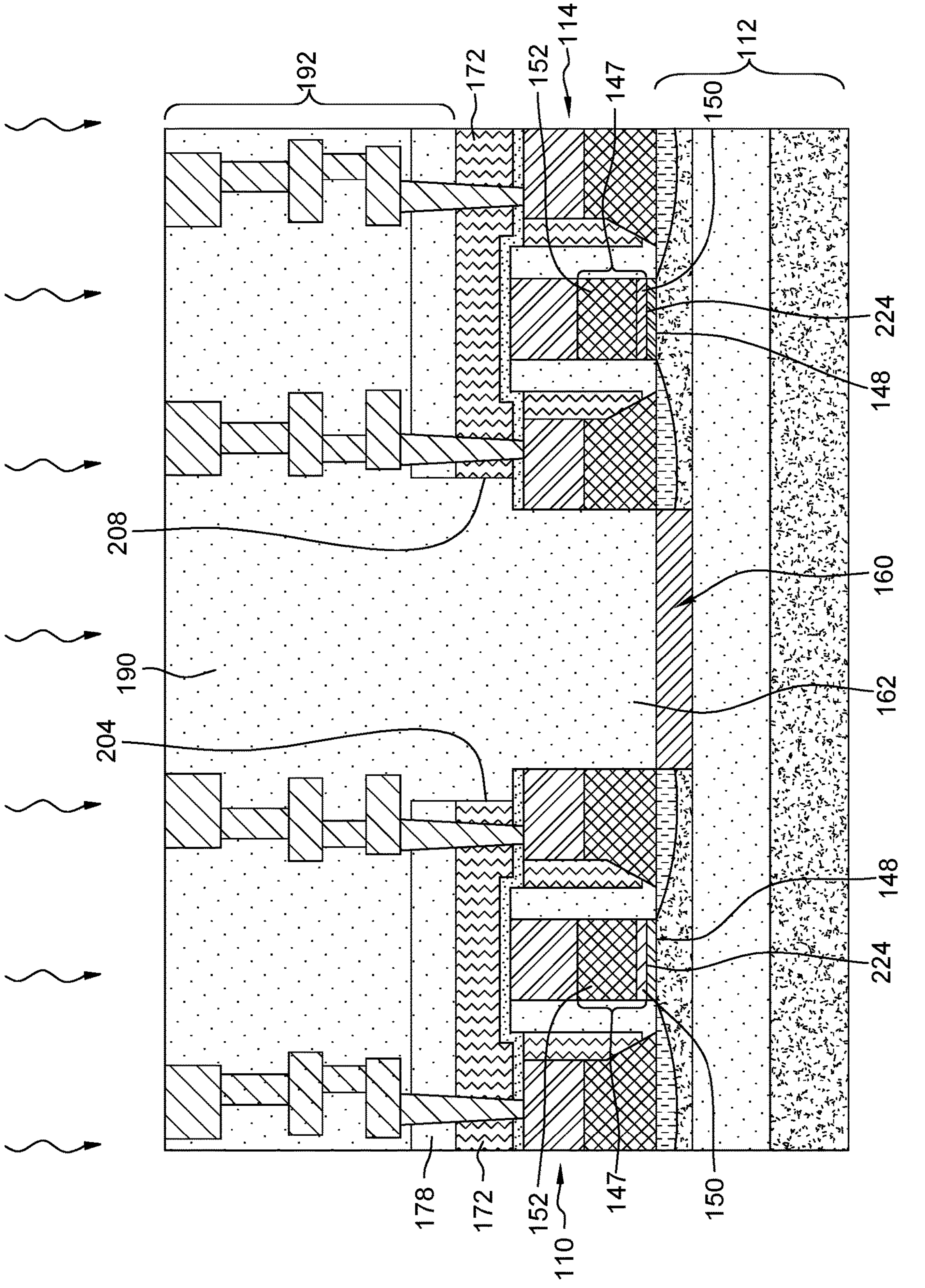
FIG. 3 shows a cross-sectional view of filling an opening in a method, according to embodiments of the disclosure.

FIGS. 1-7 show cross-sectional views of a method according to various embodiments of the disclosure. FIGS. 1-3 shows a method using a single stress-inducing liner, and FIGS. 4-7 show a method using two stress-inducing liners. FIG. 1 shows a preliminary structure 100 after forming a first transistor 110 on a substrate 112 and a second transistor 114 on substrate 112. Transistors 110, 114 may be formed using any now known or later developed semiconductor fabrication techniques.

Substrate 112 may include any now known or later developed substrate such as a bulk substrate. For purposes of description, substrate 112 is illustrated and described as a semiconductor-on-insulator (SOI) substrate. The SOI substrate includes a layered semiconductor-insulator-semiconductor substrate in place of a more conventional silicon substrate (bulk substrate). The SOI substrate includes a semiconductor-on-insulator (SOI) layer 120 over a buried insulator layer 122 over a base semiconductor layer 124. SOI layer 120 and base semiconductor layer 124 may include but are not limited to: silicon, germanium, silicon germanium, silicon carbide, and those material consisting essentially of one or more III-V compound semiconductors. It is emphasized that other suitable semiconductor materials may be possible. Buried insulator layer 122 may include any appropriate dielectric such as but not limited to silicon dioxide, i.e., forming a buried oxide (BOX) layer. A portion of or the entire semiconductor substrate may be strained. The precise thickness of buried insulating layer 122 and SOI layer 120 may vary widely with the intended application.

For purposes of description, first transistor 110 may include a n-type transistor, such as but not limited to a n-type field effect transistor (nFET), and second transistor 114 may include a p-type transistor, such as but not limited to a p-type field effect transistor (pFET). As understood in the art, the n-type and p-type indicate the types of dopants used in SOI layer 120 and the resulting polarity. Each transistor 110, 114 may include any now known or later developed structure, such as but not limited to: a channel 140 (in SOI layer 120), source/drain (S/D) regions 142, (optionally) raised S/D regions 144, and a gate 146. S/D regions 142 and raised S/D regions 144 may include any appropriate dopant within SOI layer 120. Gates 146 may include a high dielectric constant (high-K) gate dielectric layer 148. Gate dielectric layer 148 may include any now known or later developed gate dielectric materials such as but not limited to hafnium silicate (HfSiO), hafnium oxide ($HfO_2$), zirconium silicate ($ZrSiO_x$), zirconium oxide ($ZrO_2$), silicon oxide ($SiO_2$), silicon nitride ($Si_3N_4$), silicon oxynitride (SiON), high-k material or any combination of these materials. Gate 146 may include any gate conductor 147, but for purposes of description is illustrated as a metal gate. In this example, gate conductor 147 in the form of a metal gate may include one or more conductive components for providing a gate terminal of transistor 110 or 114. Gate conductor 147 may include a work function (WF) metal layer 150 and a gate conductor layer 152. WF metal layer 150 may include various metals depending on whether for an n-type or p-type transistor, but may include, for example: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TIC), titanium aluminum carbide (TiAIC), titanium aluminum (TiAl), tungsten (W), tungsten nitride (WN), tungsten carbide (WC), polycrystalline silicon (poly-Si), and/or combinations thereof. Gate conductor layer 152 may include any now known or later developed gate conductor material such as copper (Cu). Alternatively, gate 146 may include polysilicon. Gate 146 may also include sidewall spacer(s) 154 about gate dielectric layer 148, WF metal layer 150 and gate conductor layer 152. Spacer(s) 154 may include any now known or later developed spacer material such as silicon nitride. Silicide 156 may be provided on S/D regions 142 (not shown), raised S/D regions 144 and gate conductor layer 152. An optional dielectric cap 157, e.g., of oxide and/or nitride, may be provided over transistors 110, 114. As the formation and materials of transistors 110, 114 are well-known in the art, further details are not warranted.

Second transistor 114 is spaced apart from first transistor 110 by an isolation region 160. Isolation region 160 may take a variety of forms. In certain embodiments, isolation region 160 may include a trench isolation 162. Trench isolation 162 may include any now known or later developed dielectric electrically isolating different regions of substrate 112, e.g., transistors 110, 114. Trench isolation 162 may couple to buried insulator layer 122. Trench isolation 162 may be formed in a conventional manner, e.g., forming a trench through SOI layer 120 and filling the trench with an insulator such as an oxide, among other options. In other embodiments, shown with dashed lines 164 in FIG. 1 only, isolation region 160 may include a region of substrate 112, i.e., a portion of SOI layer 120, where trench isolation 162 does not extend through SOI layer 120. Suitable dielectric materials for isolation region 160 include but are not limited to: silicon dioxide (oxide) materials; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, and any silicon-containing low-k dielectric.

FIGS. 1-7 show forming at least one dielectric liner 170 over first transistor 110 and second transistor 114. The disclosure finds advantageous application relative to a stress-inducing liner 170, but can be applied to other dielectric liners. FIGS. 1-3 show an embodiment using a single stress-inducing liner 172, and FIGS. 1, 4-7 show an embodiment using dual stress-inducing liners 174, 176. Reference number 170 will be used to collectively refer to the various liners 172, 174, 176. At least one stress-inducing liner 170 (hereafter "liner(s) 170" for brevity) may include any now known or later developed stress-inducing material. The application of stresses to transistors is known to improve their performance. When applied in a longitudinal direction (i.e., in the direction of current flow), tensile stress is known to enhance electron mobility (or n-type transistor drive currents) while compressive stress is known to enhance hole mobility (or p-type transistor drive currents). One way to apply such stresses to a transistor is the use of intrinsically-stressed silicon nitride liners 170. For example, a tensile-stressed silicon nitride liner may be used to cause tension in channel 140 for n-type transistor 110, while a compressively-stressed silicon nitride liner may be used to cause compression in channel 140 of p-type transistor 114. In some cases, a single liner 170 is used (with any negative impact to the other transistor minimized through well-known stress relief processes). In other cases, a dual/hybrid liner scheme including two liners 174, 176 are used to induce different stresses in different polarity transistors 110, 114. Accordingly, in certain embodiments, liners 174, 176 may include either a tensile or compressive stress-inducing silicon nitride. (Note, it is also possible to have a neutral stress liner on some regions, e.g., converting one stress liner to a neutral/no stress using a stress relaxation implant.) Liner(s) 170 may be deposited using any appropriate deposition technique, such as but not limited to chemical vapor deposition (CVD).

One or more dielectric layers 178 may also be deposited over liner(s) 170, e.g., using CVD. Dielectric layer(s) 178 include any appropriate interlayer dielectric (ILD) layer material such as but not limited to: silicon dioxide; carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric.

For purposes of description, where a single liner 172 is used or where dual liners 174, 176 are used, the single liner or the first liner deposited is shown as a tensile stress-inducing liner over n-type transistor 110. Formation of a tensile stress-inducing liner first may be desirable because it may require an ultraviolet (UV) cure that is not required by a compressive stress-inducing liner. It will be recognized, however, a compressive stress-inducing liner over p-type transistor 114 could alternatively be used as the only liner or the first liner deposited.

FIGS. 2A-B show forming an opening 180 through single stress-inducing liner 172 over at least isolation region 160. Opening 180 may be formed by patterning a mask 182, creating an opening 188 therein, and etching opening 180 through liner 172. The term "mask" may be given to a layer of material which is applied over an underlying layer of material, and patterned to have openings, e.g., 188, so that the underlying layer can be processed where there are openings. After processing the underlying layer, the mask may be removed. Common masking materials are photoresist (resist) and nitride. Nitride is usually considered to be a "hard mask." Mask may include a developable organic planarization layer (OPL) on the layer to be etched, a developable anti-reflective coating (ARC) layer on the developable OPL, and a photoresist mask layer on the developable ARC layer. Masks may be removed using any known removal process appropriate for the mask material, e.g., a wet etch for hard nitride mask or an ashing process (oxygen dry strip process) for a soft resist-based mask. Mask 182 may include any now known or later developed masking material. The etching may include any appropriate etching chemistry for the materials to be removed, e.g., a reactive ion etch or a wet etch.

In certain embodiments, shown in FIG. 2A, opening 180 exposes at least a first portion 184 of first transistor 110 and at least a second portion 186 of second transistor 114, i.e., an upper surface thereof. For example, opening 180 may expose side surfaces of transistors 110, 114. Opening 180 may also expose portions of (optional) dielectric cap 157. Portions 184, 186 may vary depending on the shape and/or size of opening 188 in mask 182 and/or the etching process (e.g., chemistry, duration, strength, etc.). In the example shown, portions 184, 186 include portions of raised S/D regions 144 of each transistor 110, 114, but could include more or less of each transistor 110, 114. In another example, portions of silicide 156 over raised S/D regions 144 may be exposed, i.e., an upper surface thereof. In FIG. 2B, opening 180 exposes only isolation region 160, i.e., an upper surface of trench isolation 162. In any event, single stress-inducing liner 172 is removed over at least portion of isolation region 160 between transistors 110, 114. Once opening 180 is formed, mask 182 may be removed using any appropriate process for the masking material used.

FIG. 3 shows filling opening 180 with a dielectric layer 190. Dielectric layer 190 can include any ILD layer material listed herein and may match dielectric layer 178 (FIG. 1), e.g., an oxide. Any desired planarization, e.g., chemical mechanical polishing (CMP), can be performed to remove excess material and planarize the structure for further processing. Further processing may include forming a plurality of interconnect layers 192, e.g., layers of metal wires and contacts (not shown), to portions of transistors 110, 114.

As also shown in FIG. 3, subsequent processing may also include performing a high-pressure deuterium (HPD) anneal (curved arrows), e.g., after interconnect layer 192 formation. The HPD anneal injects deuterium into an interface 224 (FIGS. 8-9) of gate conductor 147 and gate dielectric layer 148, which increases threshold voltage and improves HCl. Threshold voltage (Vt) is that voltage at which a transistor turns on, e.g., conducts current from source to drain. The removal of liner 172 (FIGS. 2A-B) in at least portion of isolation region 160 between transistors 110, 114 increases the amount of deuterium injected into interfaces 224 (FIGS. 8-9) of transistors 110, 114, which further increases threshold voltage and improves HCl. It will be understood by those with skill in the art that opening 180 may be provided wherever layout restrictions allow, e.g., it will not be possible to arrange opening 180 where contacts are located.

Figure 4:
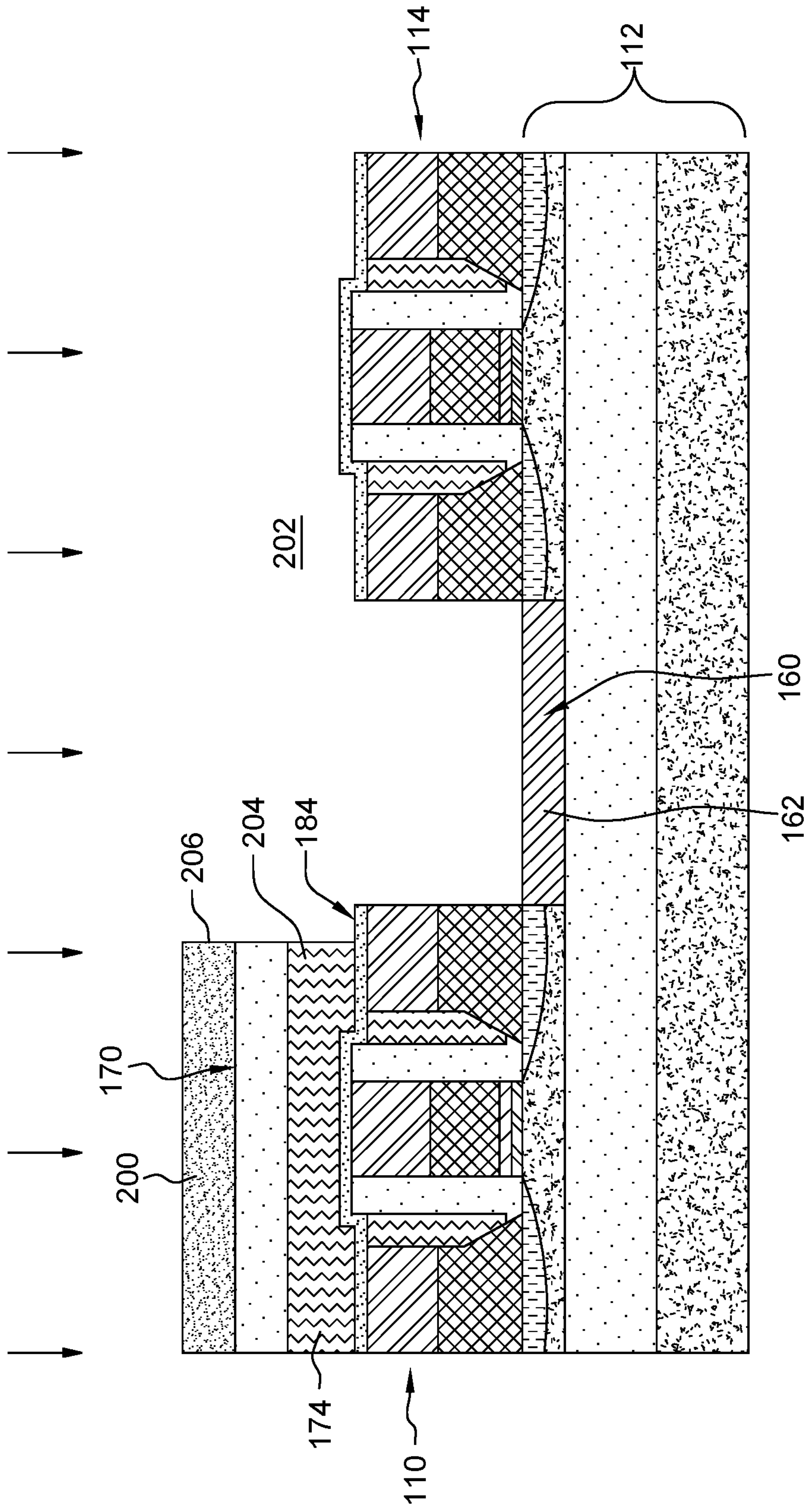
FIG. 4 shows a cross-sectional view of removing part of a first stress-inducing liner for a method, according to embodiments of the disclosure.
Figure 5:
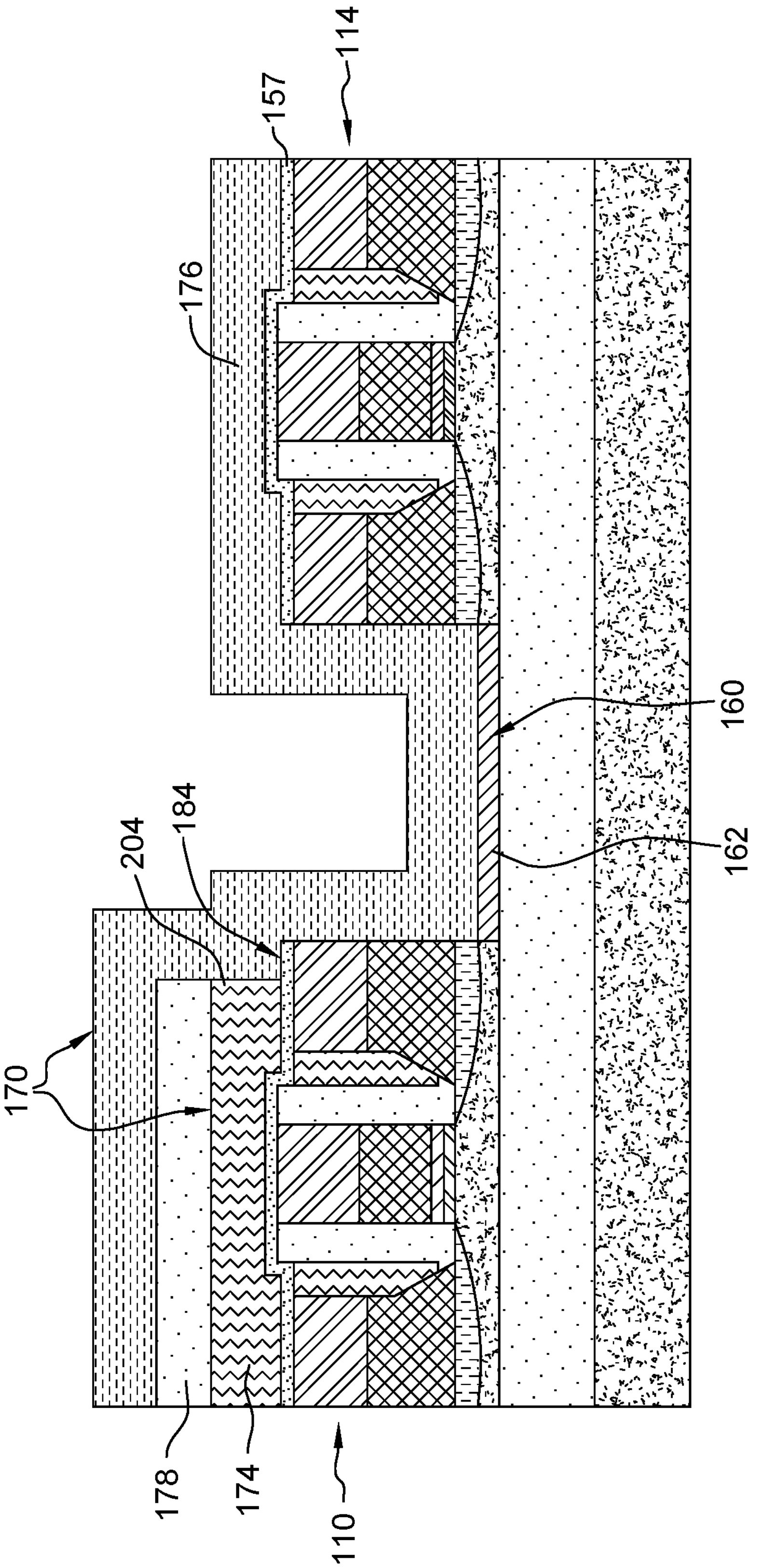
FIG. 5 shows a cross-sectional view of forming a second stress-inducing liner for a method, according to embodiments of the disclosure.

FIGS. 1, 4-7 show processing where dual stress-inducing liners 174, 176 are used. In this case, starting from preliminary structure 100 shown in FIG. 1, forming at least one stress-inducing liner 170 includes forming first stress-inducing liner 174 (FIG. 1, same as 172) over first transistor 110. In addition, as shown in FIGS. 4-5, processing includes forming a second stress-inducing liner 176 over second transistor 114. As noted, second stress-inducing liner 176 induces a different stress than first stress-inducing liner 174. In the example shown, first stress-inducing liner 174 includes a tensile stress-inducing liner, and second stress-inducing liner 176 includes a compressive stress-inducing liner. Hence, where first transistor 110 is an n-type transistor, first stress-inducing liner 174 induces a tensile stress, and where second transistor 114 is a p-type transistor, second stress-inducing liner 176 induces a compressive stress. In FIG. 4, after deposition of first stress-inducing liner 174, as shown in FIG. 1, a mask 200 may be formed and an etch performed to remove first stress-inducing liner 174 over second transistor 114 and isolation region 160. Mask 200 may include any now known or later developed masking material, e.g., a photoresist or hard mask, and the etching may include any appropriate etching chemistry for the materials to be removed, e.g., a reactive ion etch or a wet etch. In conventional processing for dual stress liners, not shown, mask 200 would be used to remove first stress-inducing liner 174 over second transistor 114 and create opening 202 such that an end 204 of liner 174 would be over isolation region 160, i.e., between first transistor 110 and second transistor 114. In contrast, in accordance with embodiments of the disclosure, as shown in FIG. 4, mask 200 is used to remove first stress-inducing liner 174 over second transistor 114, and create opening 202 that may also, optionally, expose first portion 184 of first transistor 110. Mask 200 is also used to remove first stress-inducing liner 174 over second transistor 114. In this case, an opening 206 in mask 200 may be enlarged compared to conventional processing to expose at least portion 184 of first transistor 110. Once opening 202 is formed, mask 200 can be removed, e.g., using a wet etch for hard nitride mask or an ashing process (oxygen dry strip process) for a soft resist-based mask.

FIG. 5 shows forming second stress-inducing liner 176 over second transistor 114 (and over first stress-inducing liner 174). Second stress-inducing liner 176 may overlap first stress-inducing liner 174. As noted, second stress-inducing liner 176 induces a different stress than first stress-inducing liner 174, i.e., compressive stress as described herein. At this stage, second stress-inducing liner 176 may be optionally removed from over first stress-inducing liner 174 in a conventional fashion, e.g., patterning a mask and etching. The removal process may be performed, for example, where teachings of the disclosure are not being used on other transistors—see e.g., FIGS. 8 and 9.

Figure 6A:
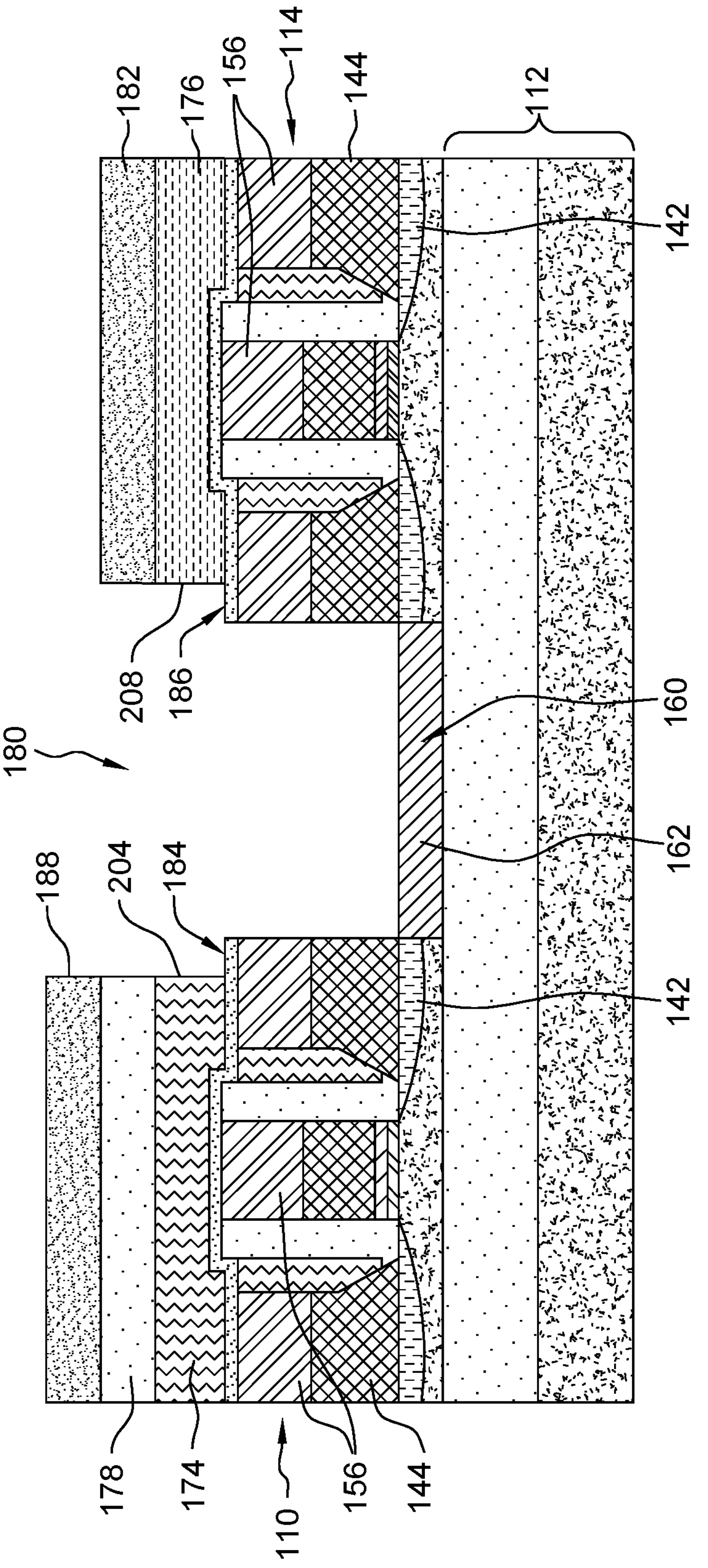
FIGS. 6A-B show cross-sectional views of forming an opening through first and second stress-inducing liners in a method, according to embodiments of the disclosure.
Figure 6B:
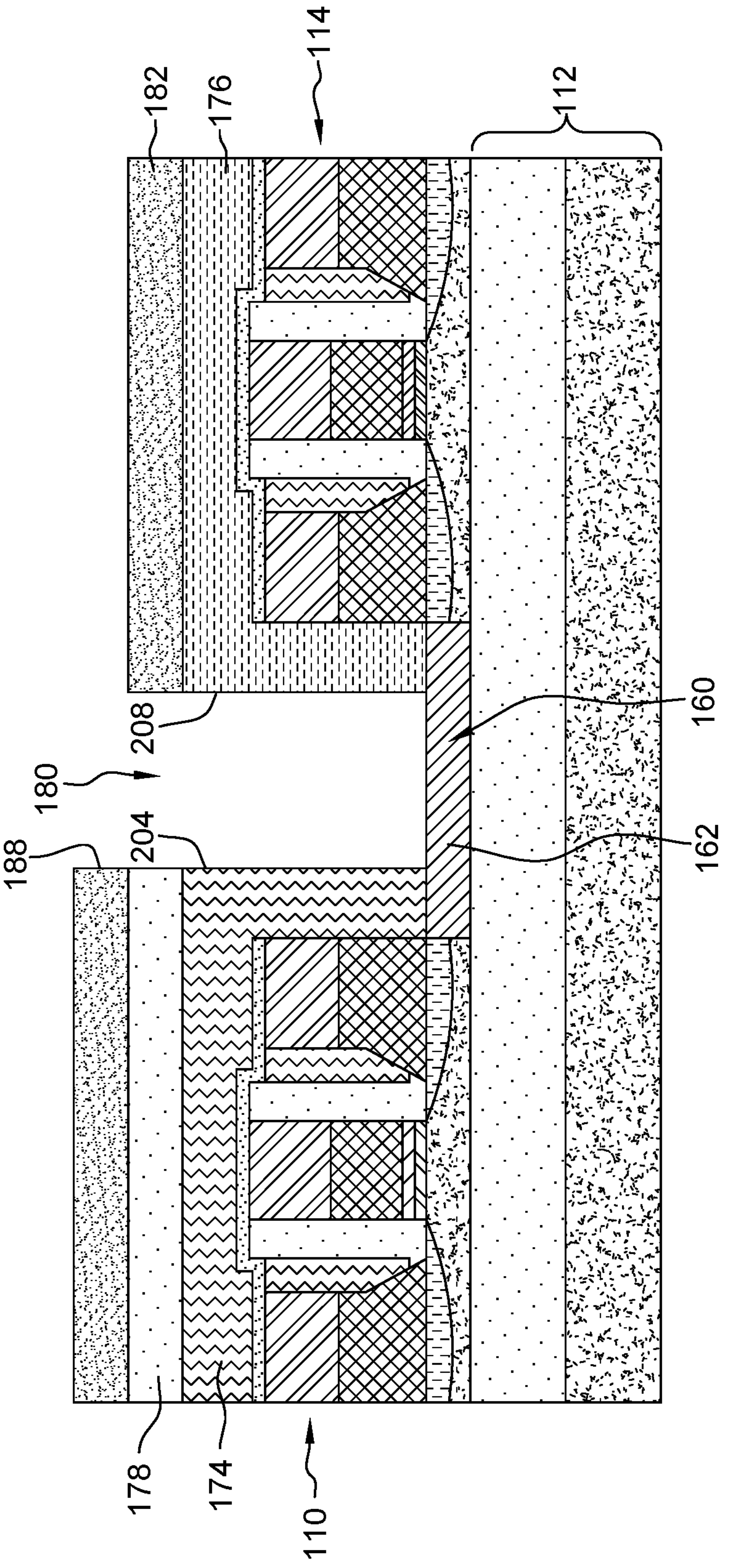

In accordance with embodiments of the disclosure, FIGS. 6A-B show forming opening 180 through dual stress-inducing liners 174, 176 over at least isolation region 160. Similar to the process described relative to FIGS. 2A-B, opening 180 may be formed by patterning mask 182, creating opening 188 therein, and etching opening 180 through second stress-inducing liner 176. Opening 188 may also be sized and/or shaped to remove part of first stress-inducing liner 174, if desired, such as more of end 204 of liner 174. Mask 182 may include any now known or later developed masking material, e.g., a photoresist or hard mask, and the etching may include any appropriate etching chemistry for the materials to be removed, e.g., a reactive ion etch or a wet etch. In certain embodiments, shown in FIG. 6A, opening 180 may expose at least first portion 184 of first transistor 110 and at least second portion 186 of second transistor 114, i.e., upper surfaces thereof. As noted, portions 184, 186 may vary depending on the shape and/or size of opening 188 in mask 182, and/or the etching performed (e.g., duration, strength, chemistry, etc.). In the example shown, portions 184, 186 include portions of raised S/D regions 144 of each transistor 110, 114, but could include more or less of each transistor 110, 114. In another example, portions of silicide 156 over raised S/D regions 144 may be exposed, i.e., upper surfaces thereof. In certain embodiments, a first end 204 of tensile stress-inducing liner 174 is over at least first portion 184 of first (n-type) transistor 110, and a second end 208 of compressive stress-inducing liner 176 is over at least second portion 186 of second (p-type) transistor 114. First end 204 and second end 208 are spaced apart over isolation region 160. In FIG. 6B, opening 180 exposes only isolation region 160, i.e., an upper surface of trench isolation 162. In any event, stress-inducing liners 174, 176 are both removed over at least portion of isolation region 160 between transistors 110, 114.

Figure 7:
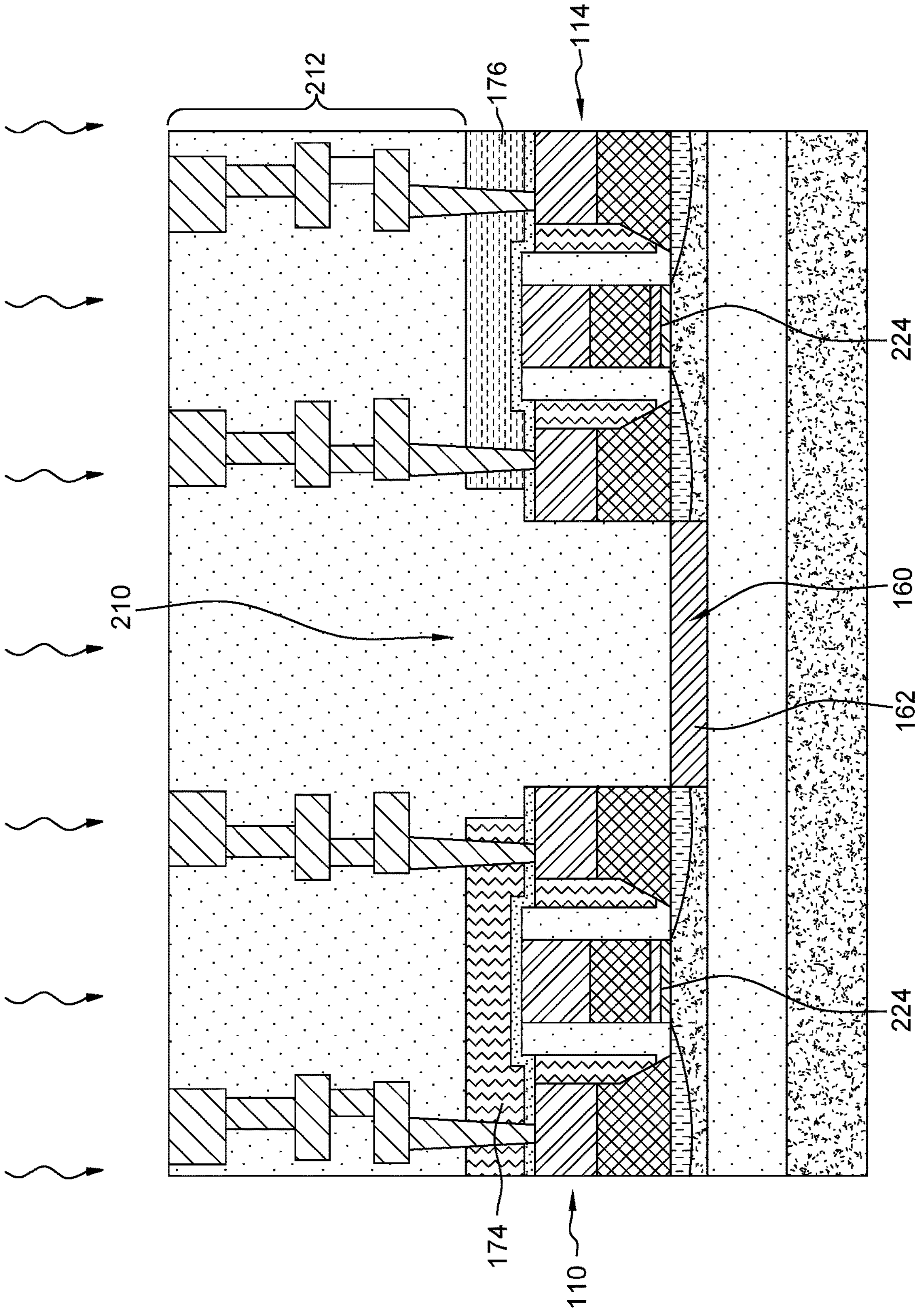
FIG. 7 shows a cross-sectional view of filling an opening in a method, according to embodiments of the disclosure.

FIG. 7 shows filling opening 180 with a dielectric layer 210. Dielectric layer 210 can include any ILD layer material listed herein and may match dielectric layer 178 (FIG. 6A or 6B), e.g., an oxide. Any desired planarization, e.g., chemical mechanical polishing (CMP), can be performed to remove excess material and planarize the structure for further processing. Further processing may include forming a plurality of interconnect layers 212, e.g., layers of metal wires and contacts (not shown), to portions of transistors 110, 114.

As also shown in FIG. 7, subsequent processing may also include performing a high-pressure deuterium (HPD) anneal (curved arrows), e.g., after interconnect layers 212 formation. The HPD anneal injects deuterium into interface 224 (FIGS. 8-9) of gate conductor 147 and gate dielectric layer 148, which increases threshold voltage and improves HCl. The removal of liners 174, 176 in at least portion of isolation region 160 between transistors 110, 114 increases the amount of deuterium injected into interfaces 224 of transistors 110, 114, which further increases threshold voltage and improves HCl. It will be understood by those with skill in the art that opening 180 may be provided wherever layout restrictions allow, e.g., it will not be possible to arrange opening 180 where contacts are located.

Figure 8:
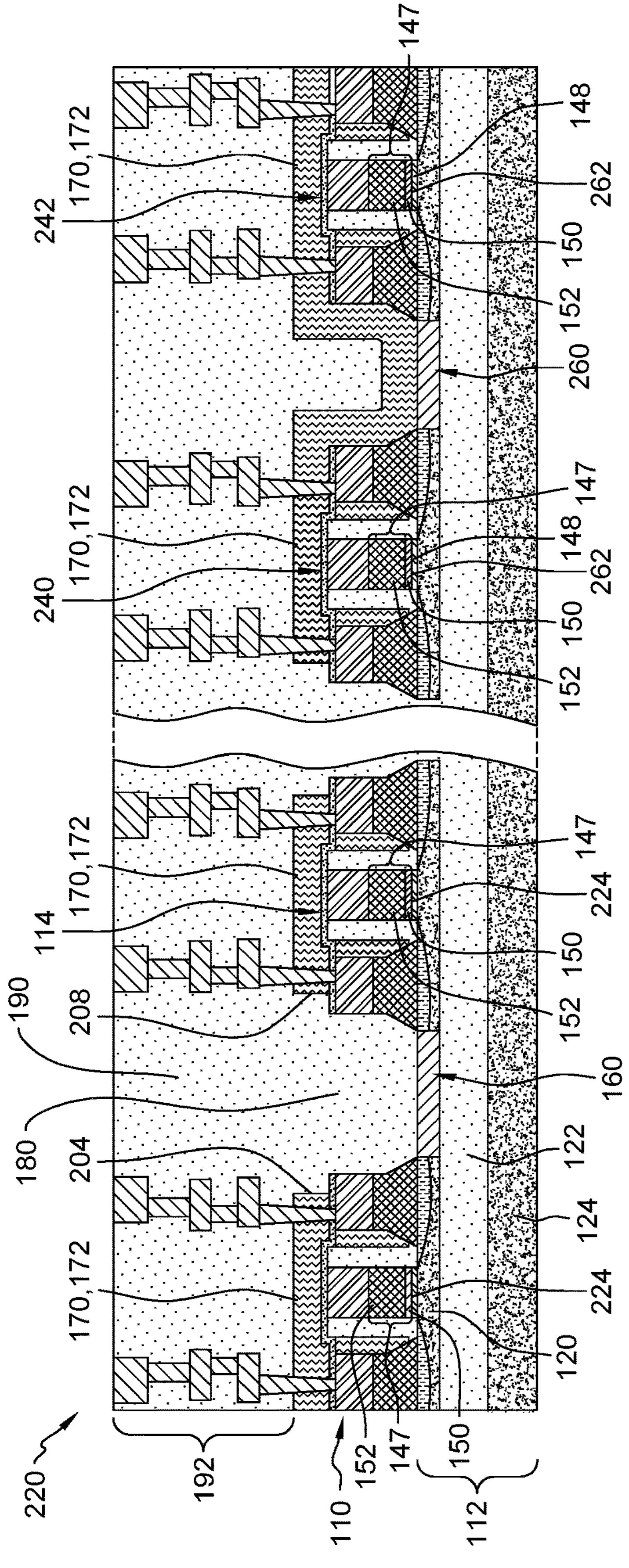
FIG. 8 shows a cross-sectional view of a structure, according to embodiments of the disclosure.
Figure 9:
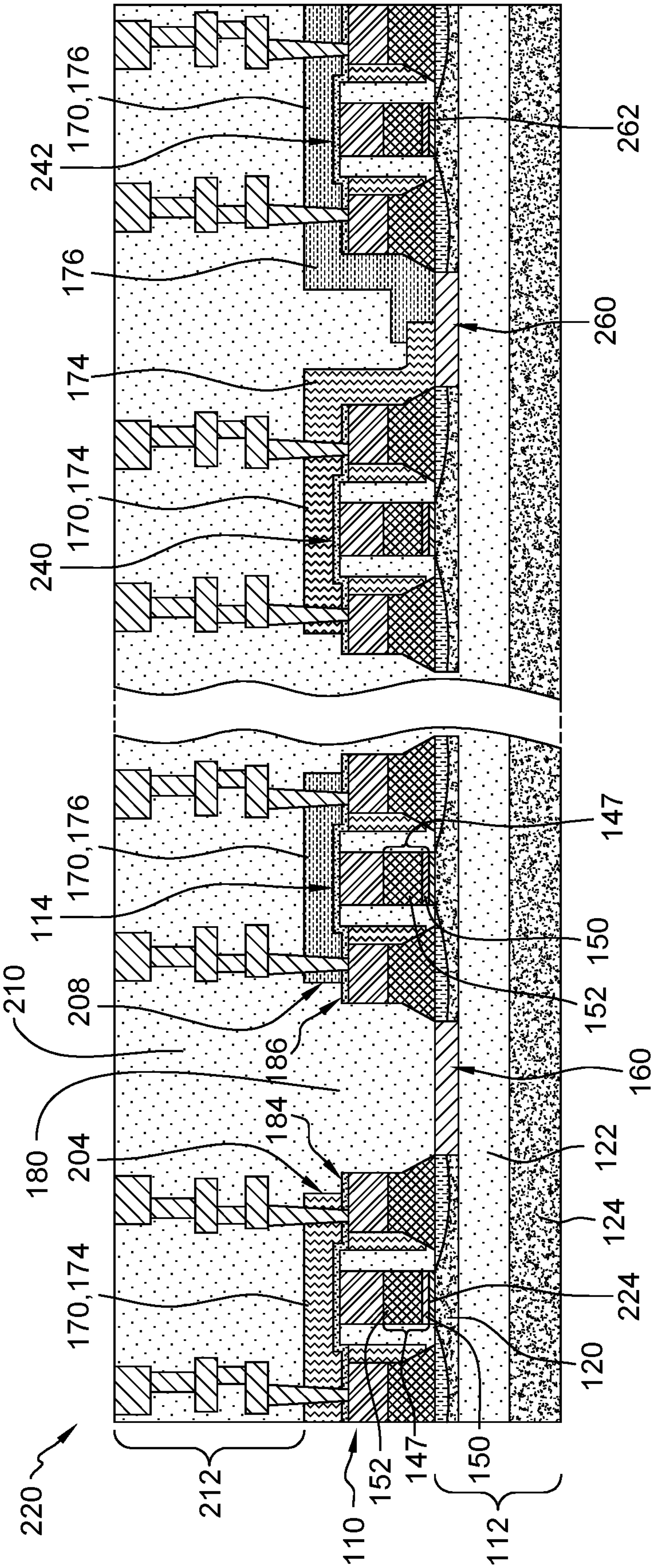
FIG. 9 shows a cross-sectional view of a structure, according to embodiments of the disclosure.

FIG. 8 shows a structure 220 based on the FIGS. 1, 2A and 3 method and FIG. 9 shows structure 220 based on the FIGS. 4-5, 6A and 7 method, according to embodiments of the disclosure. With reference to FIGS. 8 and 9, structure 220 includes substrate 112 with first transistor 110 on substrate 112 and second transistor 114 on substrate 112. Second transistor 114 is spaced apart from first transistor 110 by isolation region 160. At least one stress-inducing liner 170 is over first transistor 110 and second transistor 114. In FIG. 8, a single stress-inducing liner 172 is over first and second transistors 110, 114, and in FIG. 9, first stress-inducing liner 174 is over first transistor 110 and second stress-inducing liner 176 is over second transistor 114. More particularly, tensile stress-inducing liner 174 is over first transistor 110 and compressive stress-inducing liner 176 is over second transistor 114. That is, where first transistor 110 is an n-type transistor, first stress-inducing liner 174 induces a tensile stress, and where second transistor 114 is a p-type transistor, second stress-inducing liner 176 induces a compressive stress.

Structure 220 includes opening 180 through stress-inducing liner 172 (FIG. 8) or stress-inducing liners 174, 176 over at least isolation region 160. Isolation region 160 may include an active region of substrate 112, e.g., including a portion of SOI layer 120 as shown and described relative to FIG. 2A or 2B, or a trench isolation 162 in substrate 112, e.g., through SOI layer 120. Dielectric layer 190, 210 is in at least a portion of opening 180. Note, at locations into or out of the page and not shown, interconnect layers 192, 212 may include contacts through dielectric layer 190, 210 in opening 180. Opening 180 in the at least one stress-inducing liner 172 or 174, 176 is over at least first portion 184 of first transistor 110 and over at least second portion 186 of second transistor 114. In certain embodiments, first end 204 of stress-inducing liner 172, 174 is over at least first portion 184 of first transistor 110 and second end 208 of stress-inducing liner 172, 176 is over at least second portion 186 of second transistor 114. In contrast to conventional arrangements where: a) a single stress liner extends over both transistors, or b) two stress liners have overlapping or abutting ends between transistors, in embodiments of the disclosure, first end 204 and second end 208 of liner(s) 170 are spaced apart over isolation region 160.

As noted, structures 220 also includes deuterium in an interface 224 of gate conductor 147 and gate dielectric layer 148 in first transistor 110 and second transistor 114. As shown in FIGS. 8 and 9, structure 220 may further include a third transistor 240 on substrate 112 and a fourth transistor 242 on substrate 112. Third transistor 240 is spaced apart from fourth transistor 242 by another isolation region 260. Third and fourth transistors 240, 242 are substantially similar to transistors 110, 114, but have conventional liner(s) thereon. That is, the teachings of the disclosure in which an opening 180 is formed through stress liners between transistors 110, 114 to improve deuterium absorption are not applied to third and fourth transistors 240, 242. More particularly, at least one stress-inducing liner 170 (shown as dual stress liners 174, 176) is over third transistor 240, fourth transistor 242 and isolation region 260 between third and fourth transistors 240, 242. In this case, liner(s) 172 or 174, 176 (shown) are configured in a conventional manner. For example, a tensile stress-inducing liner 174 may be over third (n-type) transistor 240 and a compressive stress-inducing liner 176 may be over fourth (p-type) transistor 242. In isolation region 260 between transistors 240, 242, however, no opening extends through the liner(s) 172 or 174, 176. In the example shown, tensile stress-inducing liner 174 and compressive stress-inducing liner 176 overlap and/or abut one another over isolation region 260. Where a single stress liner is used, a single layer would be over isolation region 260. In any event, because liner(s) 170 cover isolation region 260, deuterium absorbed in an interface 262 between gate conductor 147 of gate 146 and gate dielectric layer 148 in third and fourth transistors 240, 242 does not include as much deuterium as interfaces 224 between gate conductor 147 of gate 146 and gate dielectric layer 148 in transistors 110, 114. Consequently, first and second transistors 110, 114 have a higher threshold voltage than third and fourth transistors 240, 242.

Figure 10:
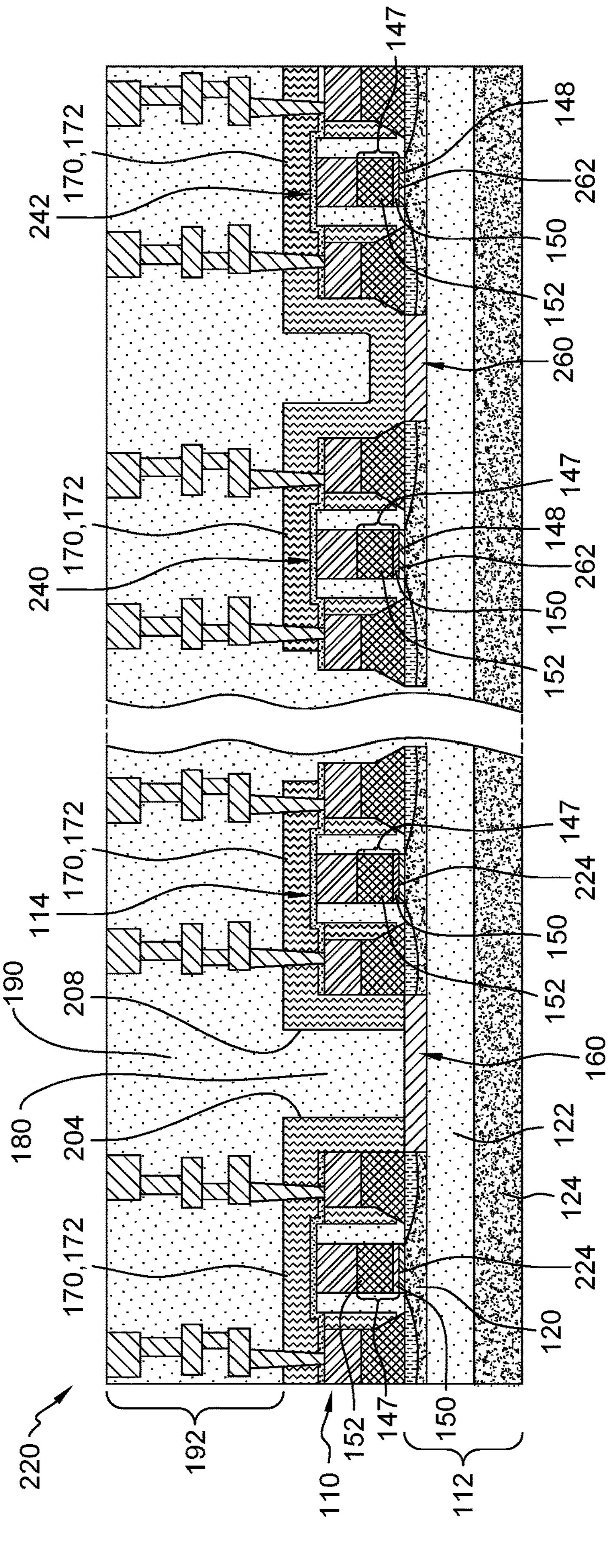
FIG. 10 shows a cross-sectional view of a structure, according to embodiments of the disclosure.
Figure 11:
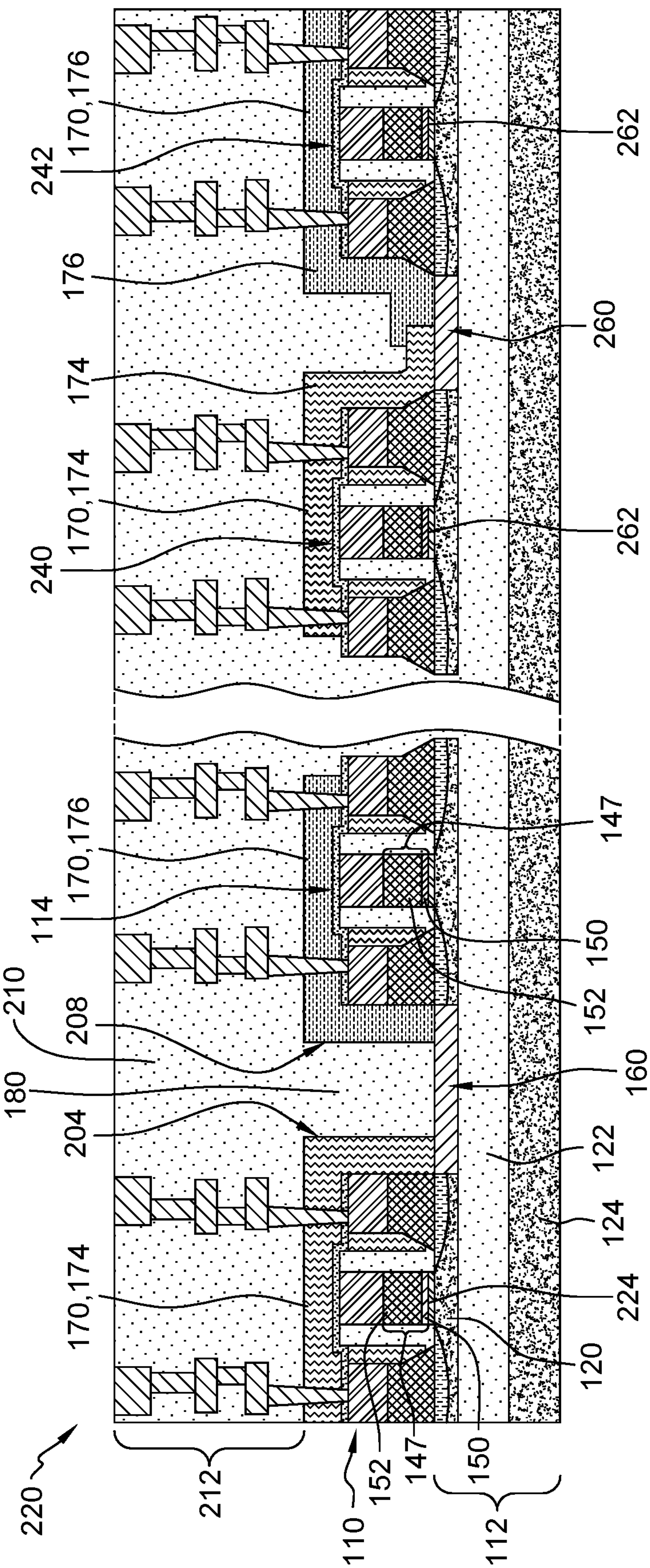
FIG. 11 shows a cross-sectional view of a structure, according to embodiments of the disclosure.

FIG. 10 shows a structure 220 based on the FIGS. 1, 2B and 3 method and FIG. 11 shows structure 220 based on the FIGS. 4-5, 6B and 7 method, according to embodiments of the disclosure. FIG. 10 is identical to FIG. 8 except only isolation region 160 is exposed by opening 180 (filled with dielectric layer 190) and portions 184, 186 (FIG. 8) of transistors 110, 114 are still covered by single stress-inducing liner 172. FIG. 11 is identical to FIG. 9 except only isolation region 160 is exposed by opening 180 (filled with dielectric layer 210) and portions 184, 186 (FIG. 9) of transistors 110, 114 are still covered by liner 174, 176, respectively.

Embodiments of the disclosure provide various technical and commercial advantages, examples of which are discussed herein. Teachings of disclosure allow for local enhanced HPD passivation, i.e., heightened absorption of deuterium near the channels of the transistors during an HPD anneal, which increases threshold voltage and improves hot carrier injection (HCl). Advantageously, no additional masking is required. In one non-limiting example, the teachings of the disclosure resulted in a 250 milli-Volt increase in threshold voltage for both n-type and p-type transistors, but no loss in performance.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure, comprising:

a substrate;

a first transistor on the substrate and a second transistor on the substrate, the second transistor spaced apart from the first transistor by an isolation region;

at least one dielectric liner over the first transistor and the second transistor;

an opening through the at least one dielectric liner over at least the isolation region, wherein the opening horizontally abuts and is immediately between a side surface of the first transistor and a side surface of the second transistor; and a dielectric layer in at least a portion of the opening.

2. The structure of claim 1, wherein the at least one dielectric liner includes at least one stress-inducing liner.

3. The structure of claim 2, wherein the at least one stress-inducing liner includes a first stress-inducing liner over the first transistor and a second stress-inducing liner over the second transistor.

4. The structure of claim 3, wherein the first transistor is an n-type transistor and the first stress-inducing liner induces a tensile stress, and the second transistor is a p-type transistor and the second stress-inducing liner induces a compressive stress.

5. The structure of claim 2, wherein the opening in the at least one stress-inducing liner is over at least a first portion of the first transistor and over at least a second portion of the second transistor.

6. The structure of claim 2, further comprising:

a third transistor on the substrate and a fourth transistor on the substrate, the third transistor spaced apart from the fourth transistor by another isolation region, and wherein the at least one stress-inducing liner is over the third transistor, the fourth transistor and the another isolation region between the third and fourth transistors, and wherein the first and second transistors have a higher threshold voltage than the third and fourth transistors.

7. The structure of claim 5, wherein a first end of the at least one stress-inducing liner is over the at least the first portion of the first transistor and a second end of the at least one stress-inducing liner is over the at least the second portion of the second transistor, and the first end and the second end are spaced apart over the isolation region.

8. The structure of claim 1, wherein the isolation region includes a region of the substrate.

9. The structure of claim 1, wherein the isolation region includes a trench isolation in the substrate.

10. The structure of claim 1, further comprising deuterium in an interface of a gate conductor of a gate and a gate dielectric layer in the first transistor and the second transistor.

11. A structure, comprising:

a substrate;

a n-type transistor on the substrate;

a p-type transistor on the substrate, the p-type transistor spaced apart from the n-type transistor by an isolation region;

a tensile stress-inducing liner over the n-type transistor;

a compressive stress-inducing liner over the p-type transistor;

an opening through the tensile stress-inducing liner and the compressive stress-inducing liner, the opening over at least a first portion of the n-type transistor and over at least a second portion of the p-type transistor, wherein the opening horizontally abuts and is immediately between a side surface of the n-type transistor and a side surface of the p-type transistor; and a dielectric layer in at least a portion of the opening.

12. The structure of claim 11, wherein a first end of the tensile stress-inducing liner is over the at least the first portion of the n-type transistor and a second end of the compressive stress-inducing liner is over the at least the second portion of the p-type transistor, and the first end and the second end are spaced apart over the isolation region.

13. The structure of claim 11, further comprising deuterium in an interface of a gate conductor of a gate and a gate dielectric layer in the n-type transistor and the p-type transistor.

14. The structure of claim 11, further comprising:

another n-type transistor on the substrate and another p-type transistor on the substrate, the another n-type transistor spaced apart from the another p-type transistor by another isolation region, and wherein the tensile stress-inducing liner is over the another n-type transistor, and the compressive stress-inducing liner is the another p-type transistor and the another isolation region, and wherein the n-type and p-type transistors have a higher threshold voltage than the another n-type and p-type transistors.

15. A method, comprising:

forming a first transistor on a substrate and a second transistor on the substrate, the second transistor spaced apart from the first transistor by an isolation region;

forming at least one stress-inducing liner over the first transistor and the second transistor;

forming an opening through the at least one stress-inducing liner over at least the isolation region, wherein the opening horizontally abuts and is immediately between a side surface of the first transistor and a side surface of the second transistor; and filling the opening with a dielectric layer.

16. The method of claim 15, wherein forming the at least one stress-inducing liner includes: forming a first stress-inducing liner over the first transistor; and forming a second stress-inducing liner over the second transistor, the second stress-inducing liner inducing a different stress than the first stress-inducing liner, and wherein forming the opening exposes at least a first portion of the first transistor and at least a second portion of the second transistor.

17. The method of claim 16, wherein forming the first transistor includes forming an n-type transistor and the first stress-inducing liner induces a tensile stress, and wherein forming the second transistor includes forming a p-type transistor and the second stress-inducing liner induces a compressive stress.

18. The method of claim 17, wherein forming the tensile stress-inducing liner includes forming a first end of the tensile stress-inducing liner over the at least the first portion of the n-type transistor and forming the compressive stress-inducing liner includes forming a second end of the compressive stress-inducing liner over the at least the second portion of the p-type transistor, and the first end and the second end are spaced apart over the isolation region.

19. The method of claim 15, wherein the isolation region includes one of: an active region of the substrate, and a trench isolation in the substrate.

20. The method of claim 15, further comprising forming a plurality of interconnect layers and performing a high-pressure deuterium anneal.

* * * * *